US005930549A

United States Patent [19]
Kim et al.

[11] Patent Number: 5,930,549
[45] Date of Patent: Jul. 27, 1999

[54] DEVELOPING DEVICE FOR SEMICONDUCTOR DEVICE FABRICATION AND ITS CONTROLLING METHOD

[75] Inventors: Dong-ho Kim, Suwon; Woung-kwan An, Inchon; Je-eung Park, Yongin; Byung-kwan Lee, Inchon, all of Rep. of Korea

[73] Assignee: Samsung Electronics Co., Ltd., Suwon, Rep. of Korea

[21] Appl. No.: 08/969,578

[22] Filed: Nov. 13, 1997

[30] Foreign Application Priority Data

Nov. 21, 1996 [KR] Rep. of Korea ...................... 96-56173

[51] Int. Cl.[6] ...................................................... G03D 5/00

[52] U.S. Cl. .......................... 396/611; 396/612; 396/627; 118/52; 427/240; 427/384

[58] Field of Search .................................... 396/604, 611, 396/627, 626, 636, 612; 118/52, 53, 56, 409; 427/96, 240, 384

[56] References Cited

U.S. PATENT DOCUMENTS 4,851,263 7/1989 Ishii et al. ................................ 118/52

FOREIGN PATENT DOCUMENTS 60-59352 4/1985 Japan .................................... 396/942
60-163436 8/1985 Japan .................................... 396/942
62-69611 3/1987 Japan .................................... 396/942
1-194323 8/1989 Japan .................................... 396/942
3-9512 1/1991 Japan .................................... 396/942
5-224429 9/1993 Japan .................................... 396/942

*Primary Examiner*—D. Rutledge
*Attorney, Agent, or Firm*—Jones Volentine, L.L.P.

[57] ABSTRACT

A developing device for a semiconductor device fabrication accomplishes complete removal of by-products formed during development of a photoresist, by inverting the wafer over a container of developer and dipping the pattern-forming face into the developer. While the wafer is still inverted over the container, the pattern-forming face is sprayed with a rinse and the wafer is spun to remove the rinse and by-products. The device includes the container provided on a table and supplied with developer, a spin chuck using vacuum suctioning the face of the wafer opposite to the pattern-forming face, a driving motor for rotating the spin chuck, a vertical driver for moving the wafer into and out of the container, and an inverting driver for rotating the spin chuck and the vertical driver so as to selectively turn the pattern-forming face of the wafer to look upward or downward.

35 Claims, 9 Drawing Sheets

DEVELOPING DEVICE FOR SEMICONDUCTOR DEVICE FABRICATION AND ITS CONTROLLING METHOD

BACKGROUND OF THE INVENTION

1. Field of the Invention

The present invention relates to a developing device for fabrication of a semiconductor device and its controlling method and, more particularly, to a developing device for fabrication of a semiconductor device and its controlling method by which by-products left on a wafer after development can be completely removed.

2. Background of the Related Art

In general, a semiconductor device is fabricated by a series of processes such as photolithography, chemical etching, depositions of thin layers and the like. Photolithography is the process of forming visible images on a wafer with photographically produced plates or masks.

Photolithography includes two steps: exposure of a photoresist on the wafer to light such as ultraviolet rays; and development of the exposed photoresist in which the latent image becomes visible.

FIG. 1 illustrates a conventional development step in the above-described photolithography. When placed on a spin chuck 2, a wafer W sticks fast to the upper surface of the spin chuck 2 with vacuum pressure supplied from the bottom of the spin chuck 2. Then, the wafer W is coated with an amount of developer and the spin chuck 2 is rotated to the left and right two or three times at a low speed so as to uniformly spread the developer onto the wafer W. A predetermined pattern is formed when the exposed area of the positive photoresist and the unexposed area of the negative photoresist react with the developer and are dissolved.

After a period of time, a rinse is spread onto the pattern in order to wash off (undesired by-products produced during the reaction of the photoresist and the developer. Then, development is completed by rotating the spin chuck 2 at a high speed so as to completely remove moisture on the wafer W by centrifugal force.

In the process as described above, development is accomplished with the pattern-formed surface of the wafer W facing upward, and the by-products on the wafer W being removed by centrifugal force caused by rotations at high speed. Therefore, it is impossible to completely remove all by-products left on the wafer, for example in the corners 3 of the hollowed areas on the patterned wafer W. Thus, by-products not removed by centrifugal force may cause deterioration of the wafer during subsequent chemical etching.

SUMMARY OF THE INVENTION

Accordingly, the present invention provides a developing device for fabrication of a semiconductor device and its controlling method by which by-products left on a wafer after development can be completely removed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a developing device for a semiconductor device fabrication includes a table, a container provided on the table and supplied with an amount of a developer, a spin chuck provided over the container for supporting an exposed wafer, a face of the wafer opposite a pattern-forming face being fixed to the spin chuck, a driving motor for rotating the spin chuck, a vertical driver for vertically conveying the spin chuck so as to move the wafer upward and downward into and out of the container, an inverting driver for rotating the spin chuck and the vertical driver by a defined angle so as to selectively turn the pattern-forming face of the wafer to look upward away from the container or downward toward the container, a developer supplier for supplying an amount of a developer into the container, and a rinse supplier for spraying a rinse onto the pattern-forming face of the wafer.

In another aspect, the present invention provides a method for controlling the developing device including the steps of: fixing an exposed wafer on a spin chuck using vacuum suction with a pattern-forming face of the wafer looking upward; turning the wafer fixed on the spin chuck by 180° by means of an inverting driver so as to turn the pattern-forming face of the wafer to look downward; performing development by vertically moving the spin chuck so as to immerse the pattern-forming face into a developer in a container, and rotating the spin chuck at a low speed for a predetermined time so as to partially dissolve a photoresist; with the pattern-forming face still looking downward, removing by-products by rotating the spin chuck at a low speed for a predetermined time while spraying a rinse onto the pattern-forming face of the wafer; and with the pattern-forming face still looking downward, removing moisture on the wafer by rotating the spin chuck at a high speed.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings illustrate an embodiment of the invention, in which.

DETAILED DESCRIPTION OF PREFERRED EMBODIMENT

Reference will now be made in detail to a preferred embodiment of the present invention, an example of which is illustrated and described with reference to FIGS. 2 through 4.

The device for development according to the present invention comprises a spin chuck 100 on which a wafer W is firmly fixed, and a wafer aligning driver 20 by which the rotary center of the wafer W is aligned with that of the spin chuck 100 before the wafer W is fixed on the spin chuck 100.

The spin chuck 100 is rotated at a low or a high speed by means of a driving motor 110. The driving motor 110 is preferably a step motor having an easy to control speed of rotation.

Figure 5:
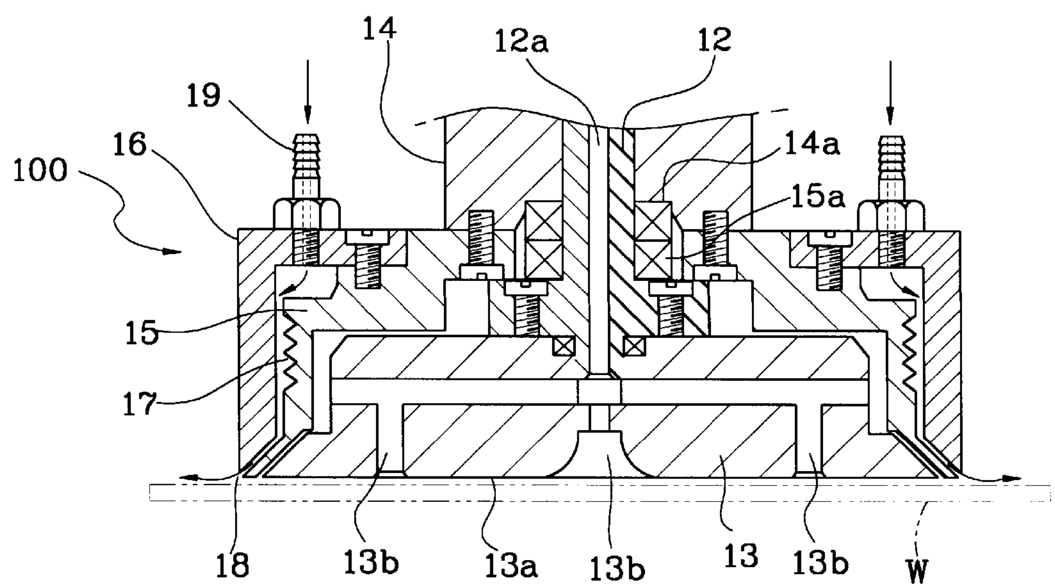
FIG. 5 is a cross-sectional view showing a spin chuck of the device for development according to the present invention.

Referring to FIG. 5 which shows the spin chuck 100 in detail, the spin chuck 100 comprises a hollow rotary shaft 12 that turns by means of the driving motor 110, and a vacuum disk 13 fixed to rotary shaft 12.

A vacuum path 12*a* connected to an external vacuum line (not shown) is formed in the rotary shaft 12, and the vacuum disk 13 has a plurality of vacuum holes 13*b* connected to the vacuum path 12*a*. Through these vacuum holes 13*b*, the face opposite to the pattern-forming face of the wafer W is firmly fixed to the vacuum surface 13*a* of vacuum disk 13 by vacuum suction. In addition, a boss 14 is provided on the outside of rotary shaft 12 so as to fix the spin chuck 100 to a vertical driver 60 that will be described later. The boss 14 is fixed to a housing 15 that covers and protects the upper part of the vacuum disk 13. The spin chuck 100 is preferably supported by the boss 14, the housing 15 and bearings 14*a* and 15*a* for the purpose of easy rotation.

The spin chuck 100 further has a wafer contaminant-proof system to prevent the face opposite the pattern-forming face of the wafer from being stained with developer. This wafer contaminant-proof system works by feeding inert gas to the circumferential edge of the face opposite the pattern-forming face of the wafer while the wafer is stuck to the vacuum disk 13.

In the wafer contaminant-proof system, a cover 16 is set over the housing 15 at a designated interval so as to form a predetermined space 17 between the housing 15 and the cover 16 and to form an opening 18 at the bottom end of the space 17. Further, a gas feed line 19 at the top of the cover 16 is used to supply the inert gas such as $N_2$. The gas feed line 19 feeds the inert gas through the space 17 and outward to the opening 18. The opening 18 is formed circumferentially along the edge of the vacuum disk 13 so as to uniformly feed the inert gas to the circumferential edge of the face opposite the pattern-forming face of the wafer W, which is shown by the dotted lines in FIG. 5.

Figure 1:
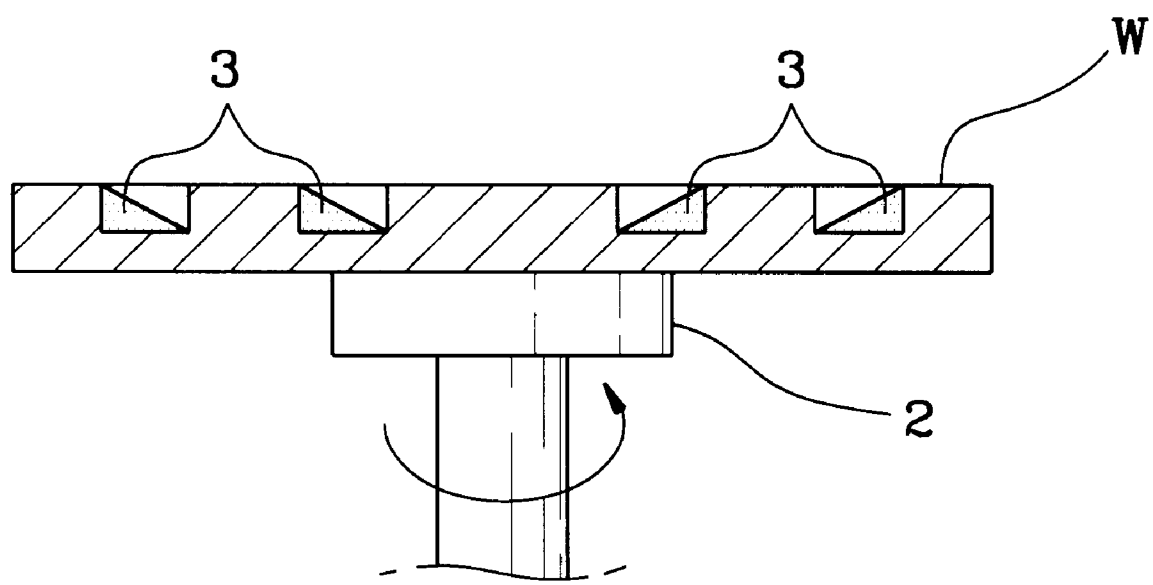
FIG. 1 is a partial cross-sectional view of a spin chuck and wafer used in a conventional development step.
Figure 2:
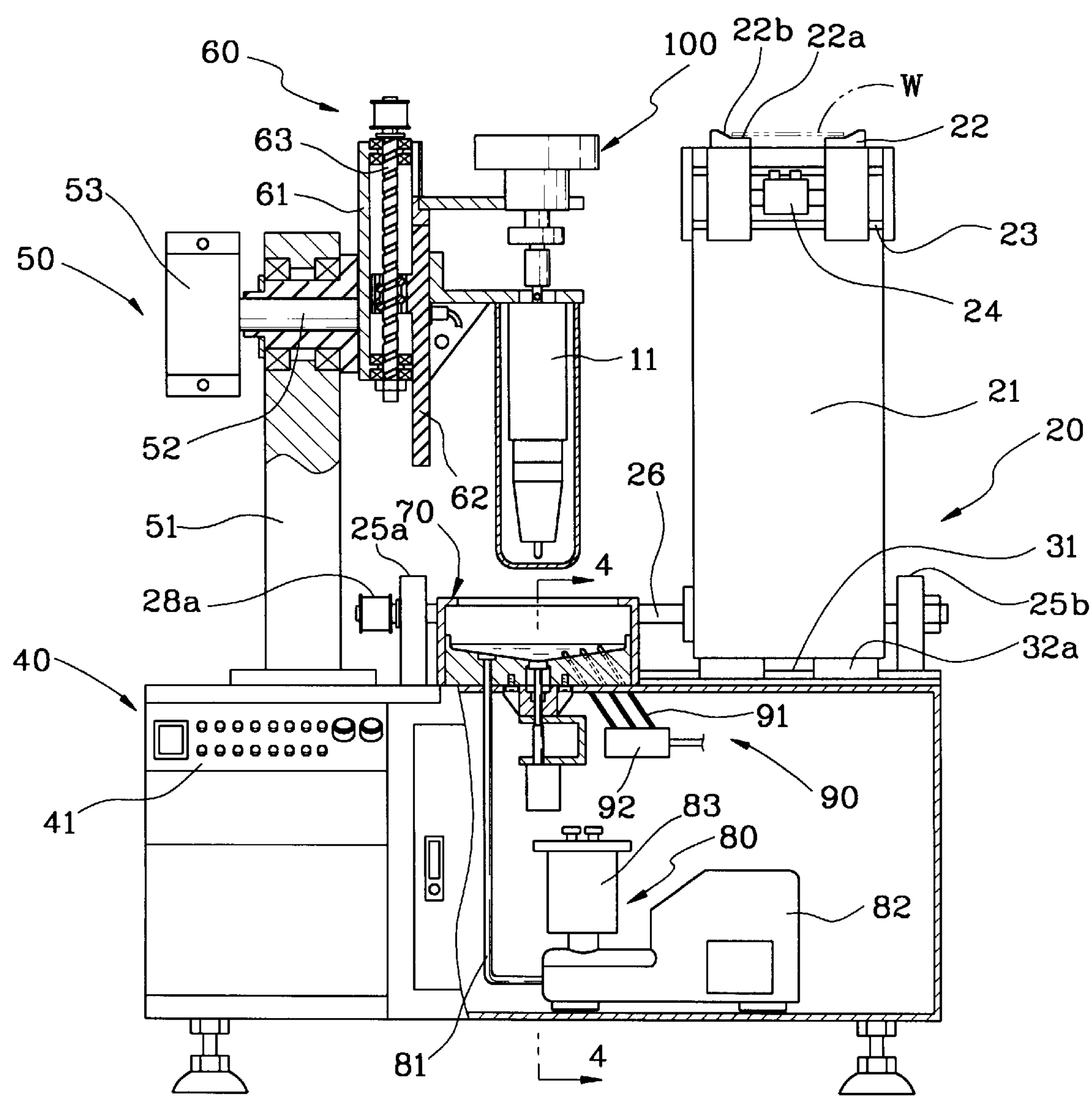
FIG. 2 is a partial cross-sectional view of a device for development according to the present invention.
Figure 6:
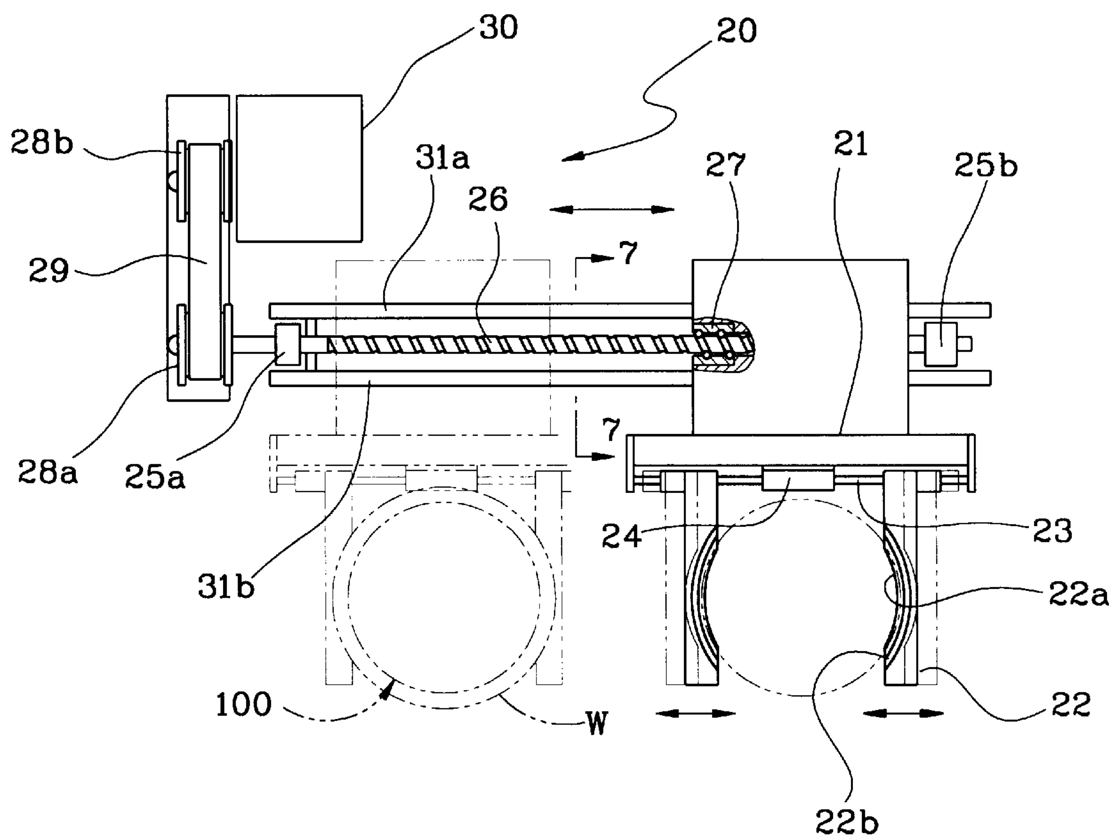
FIG. 6 is a top view of a wafer aligning driver of the device for development according to the present invention.

As shown in FIG. 2 and FIG. 6, the wafer aligning driver 20 comprises: a vertical frame 21; a pair of fingers 22 movable along a guide rod 23 at the top of the vertical frame 21 so as to center the wafer W on the fingers 22; a bi-directional rod cylinder 24 which is fixed to the vertical frame 21 so as to operate the fingers 22 with air pressure; and a wafer conveyor which moves the wafer W so as to align the rotation center of the wafer with that of the spin chuck 100.

Each finger 22 has a support surface 22*a* on which the wafer W is placed and a guide surface 22*b* to center the wafer W on the fingers 22. It is preferable to form the guide surface 22*b* such that it slants inward so as to lead the edge of the wafer W towards the support surface 22*a*.

The fingers 22 are movable along the guide rod 23 fixed at the top of the vertical frame 21. When the wafer W is over the support surface 22*a* with the fingers 22 open as shown by the dotted lines in FIG. 6, the bi-directional rod cylinder 24 drives the fingers 22 with air pressure to move into the state as shown by the solid lines so as to automatically center the wafer W on the fingers 22.

The wafer conveyor moves the vertical frame 21 carrying the wafer W fixed with the fingers 22 into position over the spin chuck 100. The wafer conveyor has a ball screw 26 with both ends rotationally supported by fixing members 25*a* and 25*b*, and a ball bearing 27 fixed to the vertical frame 21 and movable along the ball screw 26. The ball bearing 27 moves linearly, as shown by the dashed/dotted lines in FIG. 6, along the ball screw 26 as the ball screw 26 turns.

In addition, the ball screw 26 is turned clockwise or counterclockwise by means of a driving motor 30, which is coupled to and transfers the driving force to the ball screw 26 via a pair of pulleys 28*a* and 28*b* and a belt 29. The driving motor 30 controls the distance which the wafer W moves so as to align the rotation center of the wafer W with that of the spin chuck 100.

Figure 7:
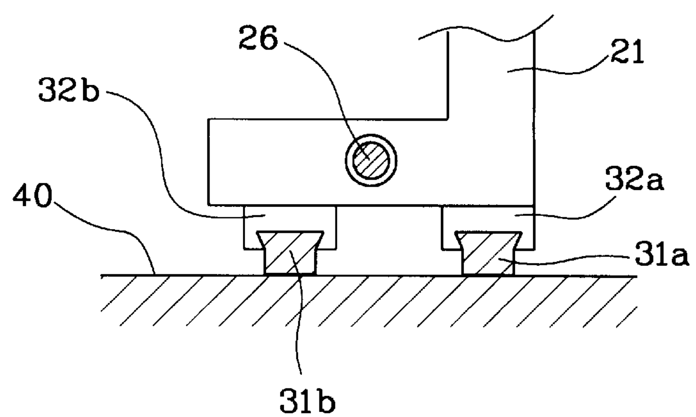
FIG. 7 is a cross-sectional view taken along the line 7—7 of FIG. 6.

As shown in FIG. 6 and FIG. 7, the vertical frame 21 is movable linearly along the ball screw 26 by means of a pair of guide rails 31*a* and 31*b* which are fixed on a table 40 in parallel with each other. Guide members 32*a* and 32*b* which hold vertical frame 21 and guide it along guide rails 31*a* and 31*b*, respectively, are fixed at the bottom surface of the vertical frame 21.

Guide members 32*a* and 32*b* fit securely and slidably on guide rails 31*a* and 31*b* in order to keep the moving vertical frame 21 from rocking. This secure fit is obtained by forming the top section of each guide rail 31*a* and 31*b* with a trapezoidal cross-section such that the guide rails 31*a* and 31*b* flare out from top to bottom. Guide members 32*a* and 32*b* are formed each having a slot with a trapezoidal cross-section, and each slot fits over the trapezoidal top section of the corresponding guide rail.

With reference to FIG. 2, the present invention further comprises an inverting driver 50 which turns the wafer W fixed on the spin chuck 100 so as to make the pattern-forming face look selectively upward or downward, and a vertical driver 60 which vertically moves the spin chuck 100.

The inverting driver 50 comprises a fixing frame 51 mounted on the table 40, and an angular driver which is mounted on the fixing frame 51 and rotates an output axis 52 by a given rotation angle clockwise or counterclockwise. The angular driver preferably employs a rotary cylinder 53 which uses air pressure, and the rotation angle of the output axis 52 is 180°.

Figure 8:
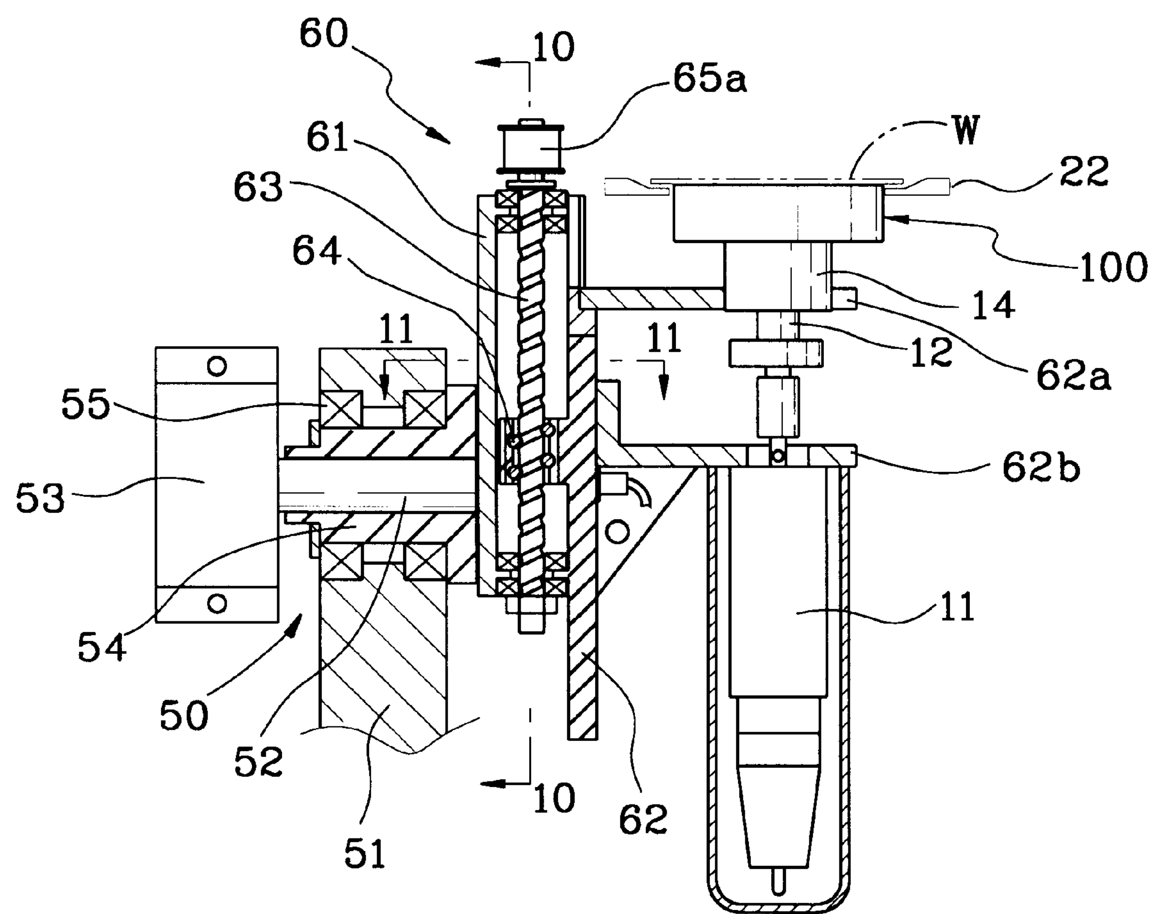
FIG. 8 is a partial cross-sectional view illustrating a wafer invert driver and a wafer vertical driver with the wafer pattern-forming face looking upward, in the device for development according to the present invention.
Figure 9:
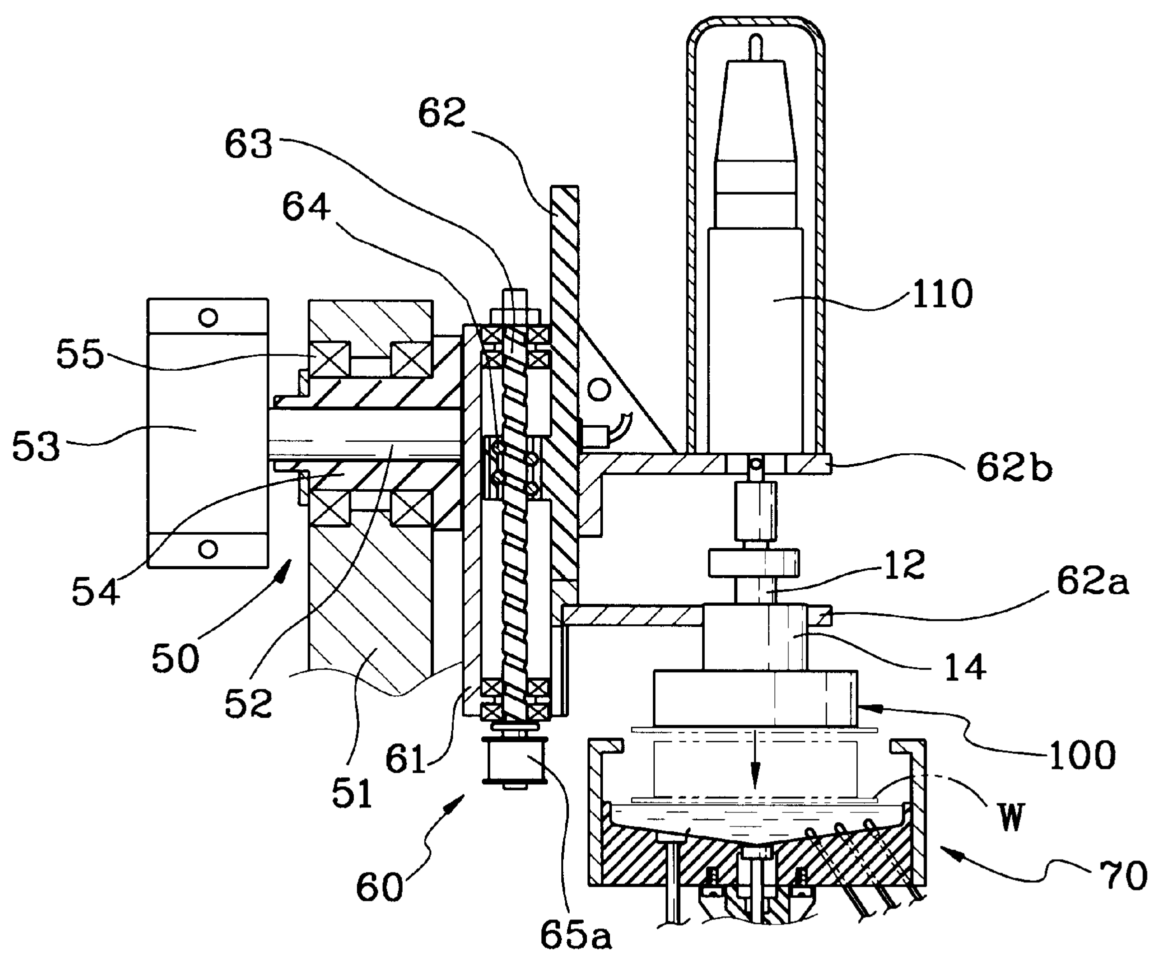
FIG. 9 is a partial cross-sectional view illustrating the construction and operation of a wafer invert driver and a wafer vertical driver with the wafer pattern-forming face looking downward, in the device for development according to the present invention.

As shown in FIGS. 8 and 9, a hub 54 is fixed to the output axis 52 and rotationally supported on the fixing frame 51 by a bearing 55. The hub 54 is fixed to the vertical driver 60.

The vertical driver 60 comprises an inverting frame 61 fixed to the hub 54 of the inverting driver 50, a slide board 62 which is movable vertically along the inverting frame 61, and a conveyor which moves the slide board 62 in the vertical direction. The slide board 62 is firmly supported by fixing the boss 14 of the spin chuck 100 and the driving motor 110 with fixing brackets 62*a* and 62*b*.

The conveyor of the slide board 62 is installed longitudinally in the inverting frame 61 and has a ball screw 63 whose both ends are supported by bearings. A ball bearing 64 fixed to one side of the slide board 62 is movably installed on the ball screw 63 and moves vertically along the ball screw 63 as the ball screw 63 rotates.

Figure 3:
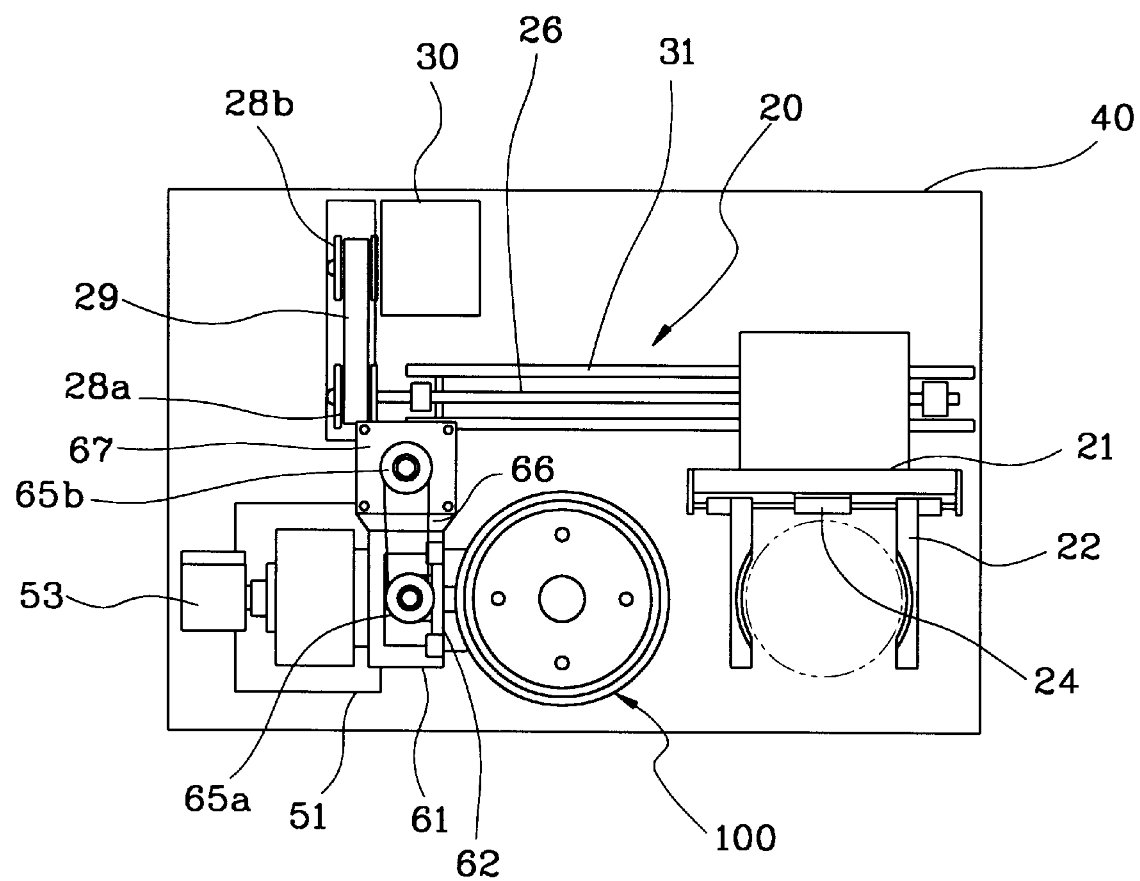
FIG. 3 is a top view of the device for development according to the present invention.
Figure 10:
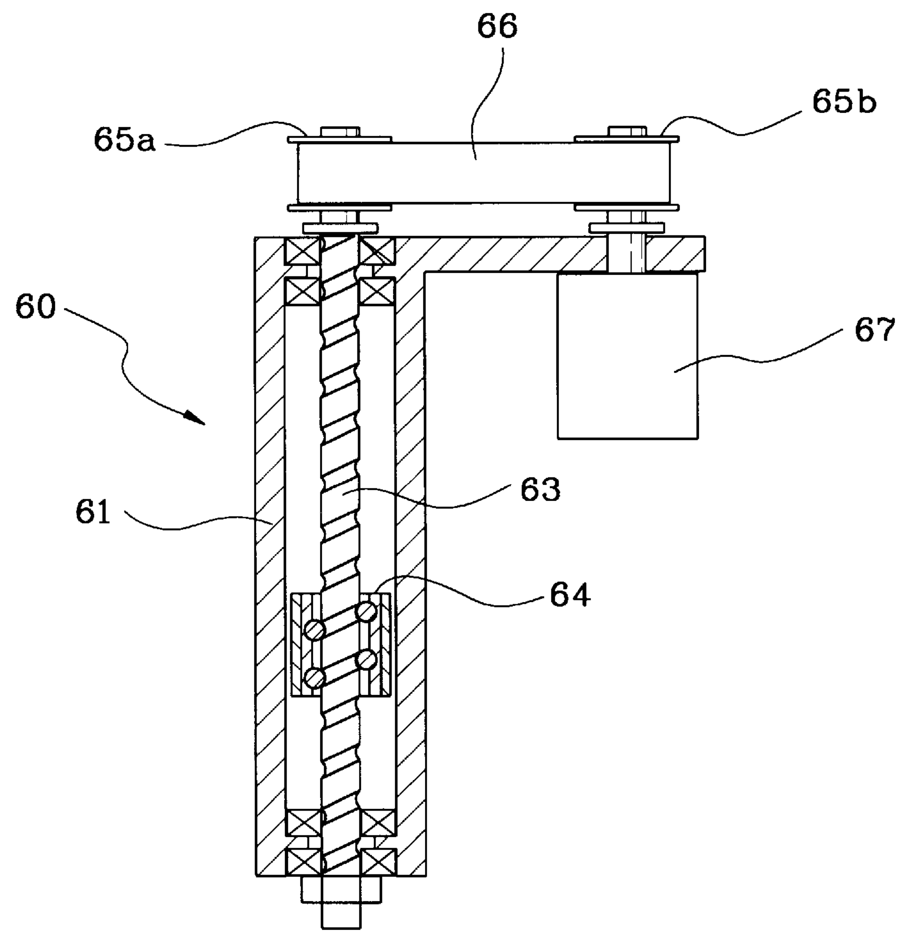
FIG. 10 is a cross-sectional view taken along the line 10—10 of FIG. 8.

As shown in FIGS. 3 and 10, the ball screw 63 is rotated clockwise or counterclockwise by means of a driving motor 67 which transfers a driving force to a pair of pulleys 65*a* and 65*b* and a belt 66. The driving motor 67 preferably employs a step motor whose rotation speed is easy to control, and it controls the distance the wafer W moves so as to move the pattern-forming face of the wafer W into or out of contact with a developer in a container 70 that will be described later.

Figure 11:
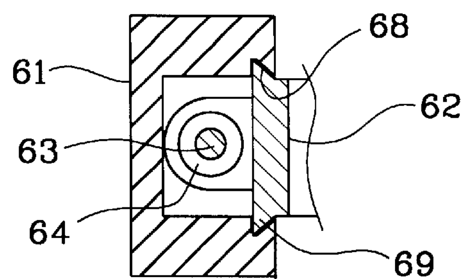
FIG. 11 is a cross-sectional view taken along the line 11—11 of FIG. 8.

The inverting frame 61 guides the slide board 62 in a vertical direction along the ball screw 63. As shown in FIG. 11, the inverting 61 has guide rail grooves 68 slidably and securely coupled with guide projections 69 formed on the slide board 62.

A secure fit is obtained by forming the guide projections 69 such that the slide board 62 flares out from right to left as shown in FIG. 11, so that the slide board 62 and guide projections 69 form a trapezoidal cross-section in the area that is coupled with guide rail grooves 68. In addition, guide rail grooves 68 are formed with a corresponding trapezoidal cross-section which fits over the trapezoidal section of slide board 62, in order to keep the moving slide board 62 from rocking.

Figure 12:
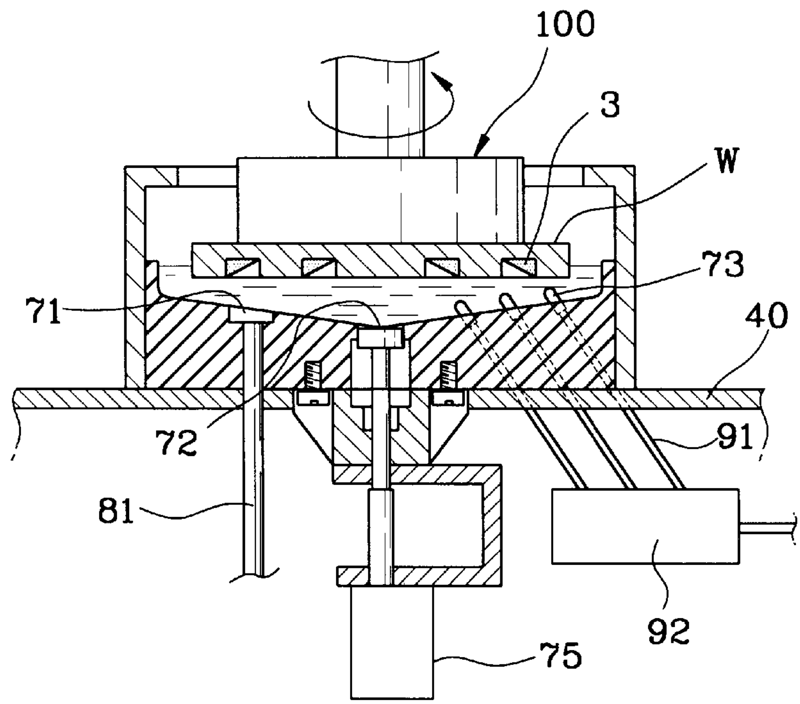
FIG. 12 is a partial cross-sectional view illustrating the spin chuck, container filled with developer, developer supplier and rinse supplier according to the present invention.
Figure 13:
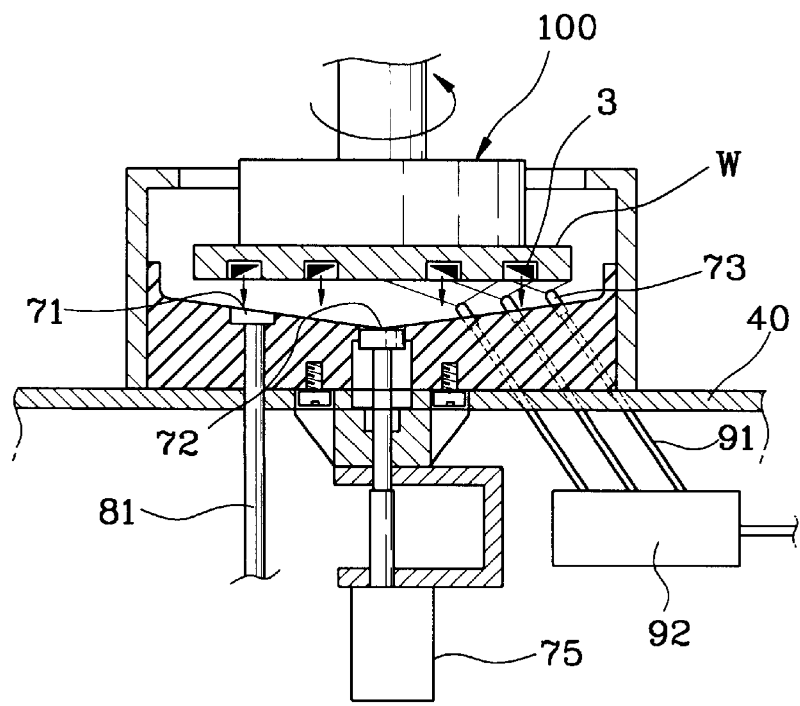
FIG. 13 is a partial cross-sectional view illustrating the spin chuck, container, developer supplier and rinse supplier supplying rinse according to the present invention.

The present invention has a container 70 which contains an amount of developer on the table 40 as shown in FIG. 2, FIG. 12 and FIG. 13. Table 40 is also provided with a developer supplier 80 to supply an amount of a developer into the container 70, and a rinse supplier 90 which supplies a rinse to be sprayed onto the pattern-forming face of the wafer W.

Referring to FIGS. 12 and 13, an opening is formed on the upper part of the container 70. The opening is large enough to allow the wafer W to move in and out of the container 70. The center of the container 70 is positioned in line with the moving axis of the spin chuck 100. Further, the container 70 is provided with a plurality of developer inlets 71, outlets 72 and nozzles 73 at the bottom thereof.

Figure 4:
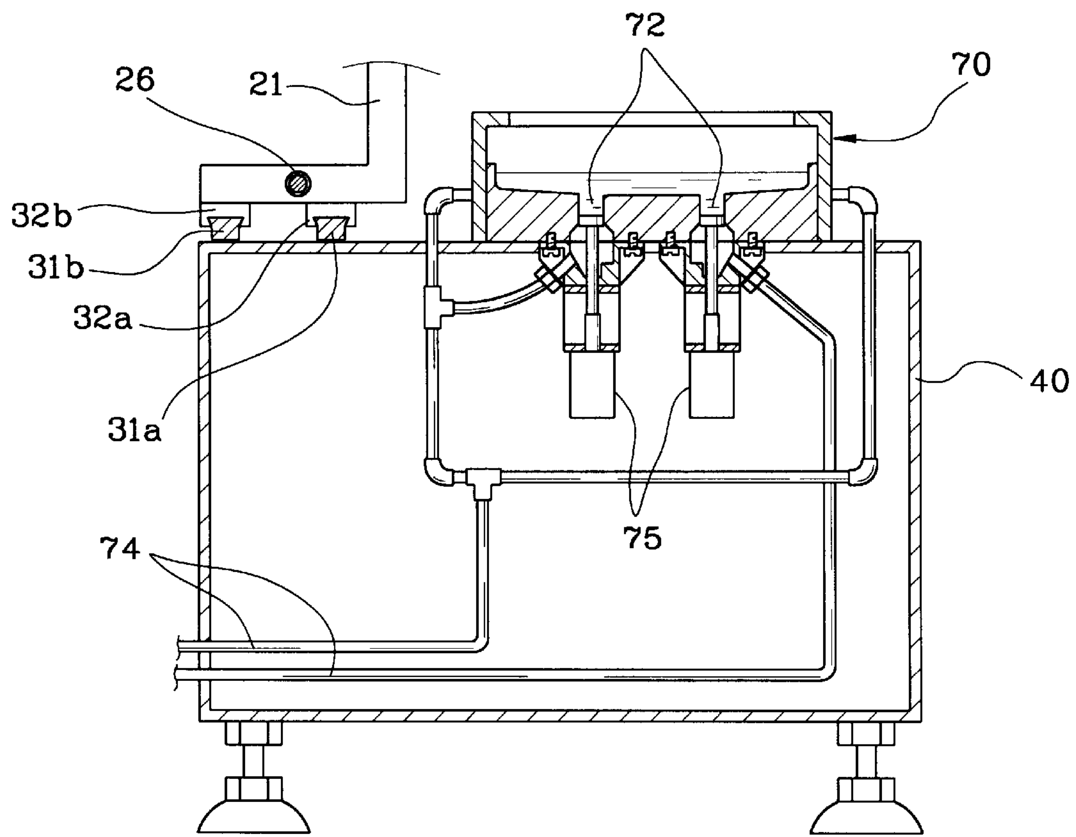
FIG. 4 is an enlarged sectional view taken along the line 4—4 of FIG. 2.

As shown in FIG. 4, the outlets 72 are connected to outlet lines 74 through which the developer and the rinse in the container 70 are let out, and each outlet 72 has a valve 75 to selectively open and close it.

As shown in FIGS. 2 and 12, the outlets 71 are connected to a developer tank 82 via developer feed lines 81 of the developer supplier 80, and the developer tank 82 has a pump 83 to supply an amount of the developer to the container 70.

The nozzles 73 are provided at the bottom of the container 70 so as to spray the rinse onto the pattern-forming face of the wafer W. The spraying angle of each nozzle 73 is preferably between 90° and 160°.

The nozzles 73 are connected to a rinse manifold 92 via rinse feed lines 91 of the rinse supplier 90 and the rinse manifold 92 is connected to an external rinse source (not shown). The rinse is preferably a deionized water.

The table 40 has a controller 41 to control the above-described respective drivers on one side thereof.

The following is a description of a method of operating and controlling the device for development according to the present invention.

As shown in FIG. 2, FIG. 6 and FIG. 7, in order to align the exposed wafer W so that its rotation center is positioned on the center of the spin chuck 100, the opened fingers 22 of the wafer aligning driver 20 place the wafer W on the support surface 22*a*. To automatically center of the wafer W on the fingers 22, the bi-directional air rod cylinder 24 operated by air pressure drives the fingers 22 to move along the guide rod 23.

Subsequently, the driving motor 30 of the wafer aligning driver 20 drives the ball screw 26 with the pulleys 28*a* and 28*b* and the belt 29 so as to turn the ball screw 26 and move the ball bearing 27 and to guide the guide members 32*a* and 32*b* of the vertical frame 21 along the guide rails 31*a* and 31*b*. Thus, the vertical frame 21 is horizontally moved and positioned on and in rotational alignment with the spin chuck 100.

The driving motor 30 is controlled to move the wafer W by a predetermined distance so as to align the position of the rotation center of the wafer W in accord with the rotation center of the spin chuck 100.

When the wafer W is positioned on the spin chuck 100, the bi-directional rod cylinder 24 drives the fingers 22 open and the wafer is dropped onto the spin chuck 100. The spin chuck 100 firmly holds the face opposite the pattern-forming face of the wafer W by vacuum suction.

As shown in FIG. 6 and FIG. 7, the vertical frame 21 is movable linearly along the ball screw 26 by means of a pair of guide rails 31*a* and 31*b* which are fixed on a table 40 in parallel with each other. Guide members 32*a* and 32*b* are fixed at the bottom surface of the vertical frame 21.

In the next step, the inverting driver 50 inverts the spin chuck 100 so as to make the pattern-forming face of the fixed wafer W look downward. This inversion is accomplished by the rotary cylinder 53 of the inverting driver 50 driving the output axis 52 so as to rotate it by 180° with the pattern-forming face down as shown in FIG. 8. The inverting frame 61 and the slide board 62 of the vertical driver 60 are concurrently rotated by 180°, and the spin chuck 100 fixed to the slide board 62 and the driving motor 110 are also rotated by 180° as shown in FIG. 9. After this, the wafer W with its pattern-forming face down is positioned over the container 70.

In the step of patterning the exposed photoresist on the wafer W with a developer, as shown in FIG. 2 and FIG. 12, the pump 83 of the developer supplier 80 pumps an amount of the developer stored in the developer tank 82 and the pumped developer is provided into the container 70 through the developer feed lines 81 and the developer inlets 71 connected to the developer feed lines 81. The amount of pumped and supplied developer is the same for each wafer.

As shown in FIG. 9, FIG. 10 and FIG. 11, the driving motor 67 of the vertical driver 60 rotates the ball screw 63 through a pair of the pulleys 65*a* and 65*b* and the belt 66. Then, the ball bearing 64 moves along the ball screw 64 and the guide projections 69 of the slide board 62 slide along the guide rail grooves 68. Therefore, the pattern-forming face of the wafer W moves downward into contact with the developer in the container 70 as shown in FIG. 12.

The distance the wafer W moves is controlled enough to immerse only the pattern-forming face of the wafer W in the developer by controlling the driving motor 67 as programmed. Due to the surface tension of the developer, the face opposite the pattern-forming face of the wafer W has to be in the same horizontal plane with the surface of the developer.

With the pattern-forming face of the wafer W immersed in the developer, development is accomplished for about 5 to 30 seconds by rotating the spin chuck 100 at a low speed between 10 and 300 rpm using the driving motor 110. During development, as shown in FIG. 5, an inert gas is supplied into the spin chuck 100 and fed to the circumferential edge of the face opposite the pattern-forming face of the wafer W through the opening 18 between the housing 15 of the spin chuck 100 and the lower part of the cover 16. Thus, the developer is kept from overflowing the circumferential edge of the face opposite the pattern-forming face of the wafer W during rotation of the spin chuck 100.

Through this development, the photoresist reacts with the developer and a defined pattern is formed on the photoresist. The used developer is let out through the developer outlets 72.

The step of removing by-products left on the wafer W by spraying a rinse is shown in FIG. 2 and FIG. 13, in which the rinse supplied from the external rinse source to the manifold 92 is provided to the nozzles 73 via the rinse feed lines 91 which spray the rinse onto the pattern-formed face of the wafer W. This rinsing is performed for about 5 to 30 seconds by rotating the spin chuck 100 at a low speed between 10 and 300 rpm.

This rinsing removes the by-products left on the pattern-formed face of the wafer W, and then the by-products and the rinse are let out through the outlets 72. As shown in FIG. 13, by-products flow out from the hollowed areas 3 of the pattern-formed face, because the pattern-formed face looks downward.

The step of removing the moisture on the wafer W is accomplished by suspending the supply of the rinse and rotating the spin chuck 100 at a high speed between 6000 and 7000 rpm for about 30 to 90 seconds. The drying is accomplished by the centrifugal force caused by the rotation of the spin chuck 100. The residual by-products at the corner of the hollowed areas 3 of the pattern-formed face of the wafer W are very effectively removed, because the pattern-formed face looks downward.

To discharge the wafer, the driving motor 67 of the vertical driver 60 is reversely driven in order to turn the spin chuck 100 and the wafer W upward in order to remove the wafer W from the container 70 as shown in FIG. 9. Then, the inverting frame 61 is rotated by 180° by driving the rotary cylinder 53 of the inverting driver 50 so as to position the wafer W on the fingers 22 of the wafer aligning driver 20 and concurrently turn the pattern-formed face up, as shown in FIG. 8.

With this, the bi-directional rod cylinder 24 drives the fingers 22 to hold the wafer W and the vacuum suction from the spin chuck 100 is eliminated. When the driving motor 30 of the wafer conveyor drives the vertical frame 21 to its original position, development is completed.

In the present invention, the above operations of the respective drivers are programmed and repeated by the control of the controller 41 provided in the table 40.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A developing device for semiconductor device fabrication, comprising:

a container supplied with an amount of a developer;

a spin chuck provided over the container for supporting an exposed wafer, a face of the wafer opposite a pattern-forming face being fixed to the spin chuck;

a driving motor for rotating the spin chuck;

a vertical driver for vertically conveying the spin chuck so as to move the wafer upward and downward into and out of the container;

an inverting driver for rotating the spin chuck and the vertical driver by a defined angle about an axis orthogonal to an axis of rotation of the driving motor so as to selectively turn said pattern-forming face of the wafer to look upward away from said container or downward toward said container;

a developer supplier for supplying said developer into the container; and a rinse supplier for spraying a rinse onto said pattern-forming face of the wafer.

2. The developing device as defined in claim 1, the vertical driver comprising:

an inverting frame fixed to the inverting driver;

a slide board being movable longitudinally along the inverting frame and having the spin chuck and the driving motor installed thereon; and a conveyor for vertically moving the slide board.

3. The developing device as defined in claim 2, the conveyor comprising:

a ball screw fixed on the inverting frame and rotationally supported at both ends of the inverting frame;

a ball bearing fixed to one side of the slide board and movably installed on the ball screw;

a driving motor for rotating the ball screw; and a pair of pulleys and a belt for transferring a driving force of the driving motor to the ball screw.

4. The developing device as defined in claim 3, wherein the driving motor is a step motor.

5. The developing device as defined in claim 3, wherein the inverting frame is provided with a pair of guide rails in parallel with the ball screw, the guide rails being coupled with guide members attached to the slide board.

6. The developing device as defined in claim 5, wherein a portion of each guide rail has a trapezoid-shaped cross-section and slidably fits into a corresponding slot in each guide member, each of said slots also having a trapezoid-shaped cross-section.

7. The developing device as defined in claim 1, the inverting driver comprises:

a fixing frame mounted on the table;

an output axis rotatably supported on the fixing frame;

a driving means mounted on the fixing frame for rotating the output axis by a defined angle; and a hub fixed to the output axis and rotationally supported on the fixing frame, said vertical driver being fixed to said hub.

8. The developing device as defined in claim 7, wherein the driving means is a rotary cylinder operated by air pressure.

9. The developing device as defined in claim 7, wherein the defined angle of rotation of the output axis by the driving means is 180°.

10. The developing device as defined in claim 1, wherein the container has an opening in an upper part thereof to allow the wafer to move in and out of the container through the opening, and a center point of the opening being aligned with a center of rotation of the spin chuck.

11. The developing device as defined in claim 10, wherein the container has a plurality of outlets connected to outlet lines for emptying a developer and a rinse out of the container.

12. The developing device as defined in claim 11, wherein the container has a plurality of developer inlets, the developer inlets being connected to the developer supplier.

13. The developing device as defined in claim 10, wherein the container has a plurality of nozzles connected to the rinse supplier.

14. The developing device as defined in claim 13, wherein the nozzles spray rinse onto the pattern-forming face of the wafer at an angle of between 90° and 160°.

15. The developing device as defined in claim 12, the developer supplier comprising:

a developer tank connected to the developer inlets and developer feed lines; and a pump for pumping a given amount of developer from the developer tank into the container.

16. The developing device as defined in claim 13, the rinse supplier comprising:

a manifold supplied with the rinse from an external rinse source; and rinse feed lines connecting the manifold to the nozzles.

17. The developing device as defined in claim 16, wherein the rinse is a deionized water.

18. A developing device for semiconductor device fabrication, comprising:

a container supplied with an amount of a developer;

a spin chuck provided over the container for supporting an exposed wafer, a face of the wafer opposite a pattern-forming face being fixed to the spin chuck, the spin chuck comprising:

a hollow rotary shaft rotated by the driving motor and having a vacuum path therein;

a vacuum disk connected to the vacuum path of the hollow rotary shaft and having a plurality of vacuum holes so as to fix the wafer onto the vacuum disk using vacuum suction;

a driving motor for rotating the spin chuck;

a vertical driver for vertically conveying the spin chuck so as to move the wafer upward and downward into and out of the container;

a boss fixed to the vertical driver and supporting the hollow rotary shaft; and a housing fixed to the boss and covering an upper part of the vacuum disk;

a developer supplier for supplying said developer into the container; and a rinse supplier for spraying a rinse onto said pattern-forming face of the wafer.

19. The developing device as defined in claim 18, the spin chuck further comprising a means for preventing contamination of the wafer, whereby an inert gas is supplied to a circumferential edge of the wafer while the wafer is fixed onto the vacuum disk.

20. The developing device as defined in claim 19, the means for preventing contamination of the wafer comprising:

a cover installed over the housing, with a predetermined spacing between the cover and the housing;

a space formed between the housing and the cover;

a first opening formed at a bottom end of the space; and a gas feed line for feeding an inert gas through the space and outward through the first opening.

21. The developing device as defined in claim 20, wherein the first opening is formed circumferentially along an edge of the vacuum disk so as to supply the inert gas uniformly at the circumferential edge of the face opposite the pattern-forming face of the wafer.

22. A developing device for semiconductor device fabrication, comprising:

a container supplied with an amount of a developer;

a spin chuck provided over the container for supporting an exposed wafer, a face of the wafer opposite a pattern-forming face being fixed to the spin chuck;

a driving motor for rotating the spin chuck;

a vertical driver for vertically conveying the spin chuck so as to move the wafer upward and downward into and out of the container;

a developer supplier for supplying said developer into the container;

a rinse supplier for spraying a rinse onto said pattern-forming face of the wafer; and a wafer aligning driver for aligning a rotation center of the wafer with a rotation center of the spin chuck.

23. The developing device as defined in claim 22, the wafer aligning driver comprising:

a vertical frame mounted on the table;

a guide rod installed at a top of said vertical frame;

a pair of fingers for supporting the wafer, said fingers being movable toward and away from each other along the guide rod to center the wafer on the fingers;

a bi-directional rod cylinder mounted on the vertical frame for operating the fingers by air pressure; and a wafer conveying means for moving the vertical frame so as to move the rotation center of the wafer as centered by the fingers into position over the rotation center of the spin chuck.

24. The developing device as defined in claim 23, each finger comprising:

a support surface on which the wafer is placed; and a guide surface inclined so as to guide the edge of the wafer onto the support surface when the fingers are moved by the bi-directional rod cylinder.

25. The developing device as defined in claim 23, the wafer conveying means comprising:

a ball screw rotationally supported by fixing members on both side ends of the table;

a ball bearing fixed to the vertical frame and movable along the ball screw so as to make the vertical frame movable according to the rotary direction of the ball screw;

a driving motor for rotating the ball screw; and a pair of pulleys and a belt for transferring a driving force of the driving motor to the ball screw.

26. The developing device as defined in claim 25, the wafer conveying means further comprising:

guide rails attached to the table and installed in parallel with each other on both sides of the ball screw; and guide members fixed on the bottom surface of the vertical frame and coupled with the guide rails.

27. The developing device as defined in claim 26, wherein a portion of each guide rail has a trapezoid-shaped cross-section and slidably fits into a corresponding slot in each guide member, each of said slots also having a trapezoid-shaped cross-section.

28. A method of controlling a developing device for semiconductor device fabrication, comprising:

fixing an exposed wafer on a spin chuck using vacuum suction with a pattern-forming face of the wafer looking upward;

turning the wafer fixed on the spin chuck about an axis which is orthogonal to an axis of rotation of the spin chuck by means of an inverting driver so as to turn the pattern-forming face of the wafer to look downward;

performing development by vertically moving the spin chuck so as to immerse the pattern-forming face into a developer in a container, and rotating the spin chuck at a low speed for a predetermined time so as to partially dissolve a photoresist;

with the pattern-forming face still looking downward, removing by-products by rotating the spin chuck at a low speed for a predetermined time while spraying a rinse onto the pattern-forming face of the wafer; and with the pattern-forming face still looking downward, removing moisture on the wafer by rotating the spin chuck at a high speed.

29. The method as defined in claim 28, wherein during the step of performing development, the spin chuck is rotated at a low speed between 10 rpm and 300 rpm for 5 to 30 seconds.

30. The method as defined in claim 28, wherein during the step of removing by-products, the spin chuck is rotated at a low speed between 10 rpm and 300 rpm for 5 to 30 seconds.

31. The method as defined in claim 28, wherein during the step of removing moisture on the wafer, the spin chuck is rotated at a high speed between 6000 rpm and 7000 rpm for 30 to 90 seconds.

32. The method as defined in claim 28, wherein, during the removing of by-products, the pattern-forming face faces the developer.

33. A method of controlling a developing device for semiconductor device fabrication, comprising:

fixing the wafer on the spin chuck using vacuum suction with a pattern-forming face of the wafer looking upward;

turning the wafer fixed on the spin chuck so as to turn the pattern-forming face of the wafer to look downward;

performing development by vertically moving the spin chuck so as to immerse the pattern-forming face into a developer in a container, and rotating the spin chuck at a low speed for a predetermined time so as to partially dissolve a photoresist, wherein during the performing of development, an inert gas is supplied to a circumferential edge of a face of the wafer opposite to the pattern-forming face in order to prevent the developer from flowing beyond the circumferential edge of the face opposite to the pattern-forming face;

with the pattern-forming face still looking downward, removing by-products by rotating the spin chuck at a low speed for a predetermined time while spraying a rinse onto the pattern-forming face of the wafer; and with the pattern-forming face still looking downward, removing moisture on the wafer by rotating the spin chuck at a high speed.

34. A method of controlling a developing device for semiconductor device fabrication, comprising:

conveying an exposed wafer so as to align a rotation center of the wafer with a rotation center of a spin chuck; fixing the wafer on the spin chuck using vacuum suction with a pattern-forming face of the wafer looking upward;

turning the wafer fixed on the spin chuck so as to turn the pattern-forming face of the wafer to look downward;

performing development by vertically moving the spin chuck so as to immerse the pattern-forming face into a developer in a container, and rotating the spin chuck at a low speed for a predetermined time so as to partially dissolve a photoresist;

with the pattern-forming face still looking downward, removing by-products by rotating the spin chuck at a low speed for a predetermined time while spraying a rinse onto the pattern-forming face of the wafer; and with the pattern-forming face still looking downward, removing moisture on the wafer by rotating the spin chuck at a high speed.

35. A method of controlling a developing device for semiconductor device fabrication, comprising:

fixing an exposed wafer on a spin chuck using vacuum suction with a pattern-forming face of the wafer looking upward;

turning the wafer fixed on the spin chuck so as to turn the pattern-forming face of the wafer to look downward;

performing development by vertically moving the spin chuck so as to immerse the pattern-forming face into a developer in a container, and rotating the spin chuck at a low speed for a predetermined time so as to partially dissolve a photoresist;

with the pattern-forming face still looking downward, removing by-products by rotating the spin chuck at a low speed for a predetermined time while spraying a rinse onto the pattern-forming face of the wafer;

with the pattern-forming face still looking downward, removing moisture on the wafer by rotating the spin chuck at a high speed; and repeating the above steps by automatic control of a controller.

* * * * *